(12) United States Patent
Maruyama et al.

(10) Patent No.: US 7,233,011 B2
(45) Date of Patent: Jun. 19, 2007

(54) METHOD OF GENERATION OF CHARGED PARTICLE BEAM EXPOSURE DATA AND CHARGED PARTICLE BEAM EXPOSURE METHOD USING A BLOCK MASK

(75) Inventors: Takashi Maruyama, Kawasaki (JP); Manabu Ohno, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 253 days.

(21) Appl. No.: 11/106,721

(22) Filed: Apr. 15, 2005

(65) Prior Publication Data
US 2006/0033048 A1 Feb. 16, 2006

(30) Foreign Application Priority Data
Aug. 10, 2004 (JP) .............................. 2004-232904

(51) Int. Cl.
H01J 37/30 (2006.01)
(52) U.S. Cl. ............................................... 250/492.22
(58) Field of Classification Search ........... 250/492.22, 250/398; 347/230; 430/5
See application file for complete search history.

(56) References Cited

U.S. PATENT DOCUMENTS 5,376,802 A * 12/1994 Sakamoto et al. ..... 250/492.23

FOREIGN PATENT DOCUMENTS

JP 2849184 11/1998

\* cited by examiner

*Primary Examiner*—Kiet T. Nguyen
(74) *Attorney, Agent, or Firm*—Westerman, Hattori, Daniels & Adrian, LLP.

(57) ABSTRACT

A method of generation of exposure data for charged particle beam exposure using a block mask, in which a first transmission beam is formed by transmission of a charged particle beam through a rectangular first transmission aperture; a second transmission beam is formed by causing the first transmission beam to be transmitted through a block mask having a plurality of discrete patterns; and the second transmission beam irradiates an object for exposure. This exposure data generation method has a step of generating irradiation position data of the first transmission beam on the block mask, such that the Y-direction or X-direction edge of the first transmission beam is positioned in a common isolated area in the X direction or Y direction of the plurality of discrete patterns in the block mask.

12 Claims, 16 Drawing Sheets

METHOD OF GENERATION OF CHARGED PARTICLE BEAM EXPOSURE DATA AND CHARGED PARTICLE BEAM EXPOSURE METHOD USING A BLOCK MASK

CROSS-REFERENCE TO RELATED APPLICATIONS

This application is based upon and claims the benefit of priority from the prior Japanese Patent Application No. 2004-232904, filed on Aug. 10, 2004, the entire contents of which are incorporated herein by reference.

BACKGROUND OF THE INVENTION

1. Field of the Invention

This invention relates to a method of generation of charged particle beam exposure data and a charged particle beam exposure method using a block mask, and in particular relates to an exposure data generation method and exposure method enabling the partial use of a block mask.

2. Description of the Related Art

In charged particle beam exposure methods, an electron beam or other charged particle beam is formed into a desired pattern and made incident on a resist layer on a wafer or mask which is the object for exposure, to form a fine pattern. In order to accommodate demands in recent years for finer patterns, wafers are directly irradiated with electron beams.

In a charged particle beam exposure method (below, an electron beam exposure method is considered as one such example), an electron beam formed by an electron gun is caused to pass through a first slit having a rectangular transmission aperture, to form a rectangular first transmission beam; this first transmission beam is further made partially incident on a second slit having a rectangular transmission aperture, to generate a second transmission beam formed into the desired rectangular shape, which is made incident on the wafer. Because of the increased number of patterns for exposure accompanying higher LSI integration levels, exposure using the above-described variable rectangular beam results in lowered throughput.

Hence it has been proposed that in the case of repeating patterns, a mask having the pattern of the unit of repetition is formed, and in place of a second slit, the first transmission beam be made incident on this repeating-pattern mask, causing an electron beam formed into the repeating pattern to be incident on the wafer. This is for example described in Japanese Patent Laid-open No. H04-100208. This method is called the partial batch transfer exposure method, because a portion of a plurality of LSI patterns is exposed all at once. Because the repeating pattern mask corresponds to a partial block mask, this method is also called a block exposure method. In this specification, "block exposure method" is used.

SUMMARY OF THE INVENTION

A block mask exposure method enables simultaneous exposure of a plurality of patterns. Hence compared with exposure methods using a variable rectangular beam, a block mask exposure method makes possible reduction of the number of electron beam shots, so that throughput of the exposure step can be improved. However, the types of block mask patterns that can be formed in a block mask are limited to a fixed number by constraints such as the size of the exposure equipment. And, after a certain mask substrate has been set within the equipment, it is desirable that wafer exposure be completed using this mask substrate if possible; switching among a plurality of mask substrates is not advantageous for improving throughput. Hence there is a need to make effective use of a fixed number of block masks provided within a single mask substrate to perform exposure.

In order to make effective use of limited types of block mask patterns, it is desirable that a first transmission beam, obtained by shaping an electron beam, be made incident only on a portion of a block mask pattern, to make partial use of the block mask pattern. In the above-mentioned Japanese Patent Laid-open No. H04-100208, partial use of a block mask is proposed.

However, in Japanese Patent Laid-open No. H04-100208, there is no description of a method of generation of exposure data using a block mask. Exposure data is generated from design data having a vast quantity of pattern data; this exposure data is provided to the exposure equipment, and the exposure equipment performs exposure based on the exposure data. These inventors have studied how the exposure data in which a block mask is partially used should be generated by converting such design data into exposure data.

Hence an object of this invention is to provide a method of generation of partial-irradiation block mask exposure data for partial irradiation of a block mask.

A further object of the invention is to provide an exposure method for calibration of exposure equipment making partial use of a block mask.

In order to attain the above objects, a first perspective of the invention is a method of generation of exposure data for charged particle beam exposure using a block mask, in which a first transmission beam is formed by transmission of a charged particle beam through a rectangular first transmission aperture; a second transmission beam is formed by causing the first transmission beam to be transmitted through a block mask having a plurality of discrete patterns; and the second transmission beam irradiates an object for exposure. This exposure data generation method has a step of generating irradiation position data of the first transmission beam on the block mask, such that the Y-direction or X-direction edge of the first transmission beam is positioned in a common isolated area in the X direction or Y direction of the plurality of discrete patterns in the block mask.

In the above first perspective, a preferred embodiment has a step of determining the Y-direction or X-direction projection area of a plurality of discrete patterns on the X axis or Y axis for the plurality of discrete patterns of the block mask, and a step of generating the irradiation position data such that the edge of the first transmission beam is positioned in an area between the projection areas.

In the above first perspective, a preferred embodiment has a step of determining, while scanning the first transmission beam over the plurality of discrete patterns of the block mask, the overlapping area of the first transmission beam and the discrete patterns at different scanning positions, and a step of generating, as the irradiation position data, the scanning position at which the rate of area increase of the overlapping area with respect to changes in the scanning position is zero.

In the above first perspective, a preferred embodiment has a step of determining the common isolated area based on the size and pitch of a plurality of discrete patterns of the block mask, and a step of generating the irradiation position data such that the edge of the first transmission beam is positioned in the common isolated area.

In order to attain the above objects, a second perspective of the invention is a charged particle beam exposure method using a block mask, in which a first transmission beam is formed by transmission of a charged particle beam through a rectangular first transmission aperture; a second transmission beam is formed by causing the first transmission beam to be transmitted through a block mask having a plurality of discrete patterns; and the second transmission beam irradiates an object for exposure. This charged particle beam exposure method has a step in which, while causing the second transmission beam to irradiate a beam intensity sensor which measures beam intensity, the first transmission beam scans the plurality of discrete patterns of the block mask, and calibration is performed taking the scanning position at which the change in detected intensity of the beam intensity sensor is substantially zero, to be the irradiation position data.

By means of the first perspective, exposure data can be generated for exposure using only a portion of the plurality of discrete patterns of a block mask. By means of the respective embodiments, a comparatively simple algorithm can be used to compute data for the irradiation position of the first transmission beam on the block mask.

By means of the second perspective, a simple method can be used to calibrate irradiation position data when deviation occurs between irradiation position data and the actual irradiation position due to aging of the exposure equipment.

DESCRIPTION OF THE PREFERRED EMBODIMENTS

Below, embodiments of the invention are explained using the drawings. However, the technical scope of the invention is not limited to these embodiments, but extends to the inventions described in the scope of claims and to inventions equivalent thereto.

Figure 1:
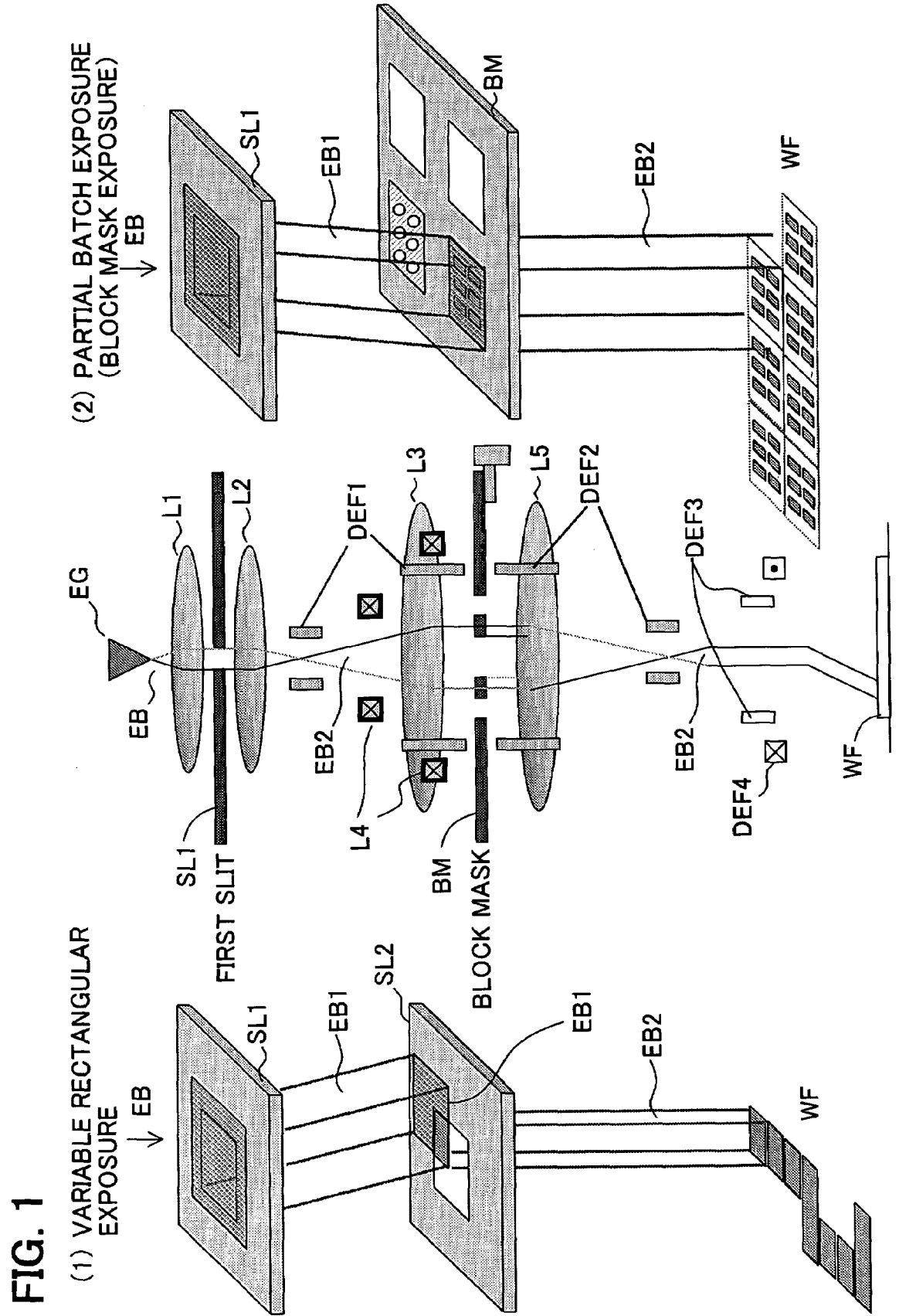
FIG. 1 explains variable rectangular exposure and partial batch exposure (block exposure)

FIG. 1 explains variable rectangular exposure and partial batch exposure (block exposure). In the center of FIG. 1 is shown in summary the configuration of electron beam exposure equipment. In the electron beam exposure equipment, an electron beam EB generated by an electron gun EG is passed through a first slit SL1 having a transmission aperture, to create a rectangular-pattern first transmission beam EB1. Lenses L1 and L2 are provided above and below the first slit SL1. The first transmission beam EB1 irradiates one of the masks of a block mask BM in which are provided block masks with a plurality of patterns; the second transmission beam EB2, having passed therethrough, is deflected by an electrostatic deflector DEF3 and electromagnetic deflector DEF4 and is irradiated at a desired position of the wafer WF which is the object for exposure. Lenses L1 and L2 are provided above and below the first slit SL1, and lenses L3, L4, L5 are provided above and below the block mask BM.

In the case of variable rectangular exposure, a second slit SL2 having a rectangular transmission aperture is used in place of the block mask BM. There are also cases in which a mask having a rectangular transmission aperture within the block mask BM is used. In variable rectangular exposure, the first transmission beam EB1 is deflected in a prescribed direction, to irradiate a portion of the area of the transmission aperture of the second slit SL2; on passing through the transmission aperture SL2, a second transmission beam EB2 with the desired rectangular size is created, and this beam irradiates the desired position of the wafer WF which is the object for exposure. Hence in the case of variable rectangular exposure, the first transmission beam EB1 is deflected by the deflectors DEF1 and DEF2 provided above and below the second slit SL2 so that the second transmission beam EB2 is created.

In the case of block exposure, a plurality of types of block masks are provided in the block mask BM. In the example of FIG. 1, four types of mask are provided; of these, two are block masks having a plurality of discrete patterns, and the remaining two are masks having rectangular patterns, used in variable rectangular exposure. In the case of a block mask, the first transmission beam EB1 irradiates a desired block mask position, causing the beam to pass through and creating a second transmission beam EB2 having the block mask pattern, which irradiates the desired position on the wafer WF which is the object for exposure. By this means, the wafer WF is exposed in one shot to a block mask pattern having a plurality of discrete patterns.

A block mask need not necessarily have a plurality of discrete patterns, but may for example combine cross shapes, L-shapes or similar. However, often a repeating pattern on an LSI device is exposed using a block mask of a unit of the repeating pattern; in such cases, the block mask often has a plurality of discrete patterns. For example, there may be dummy patterns between wires, a plurality of contact holes, cell area patterns in memory devices, and similar.

Figure 2:
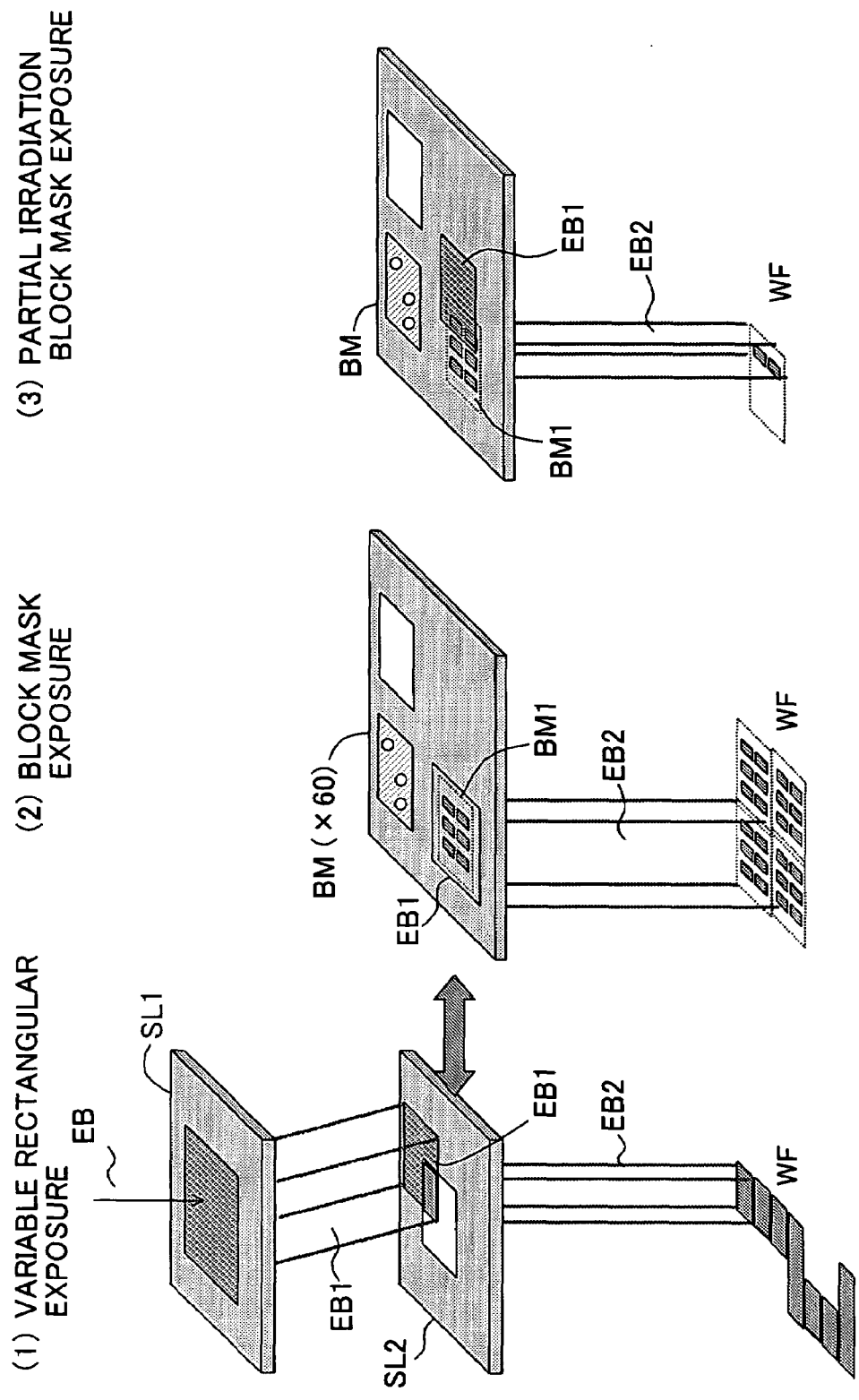
FIG. 2 explains the partial-irradiation block mask exposure method in an embodiment.

FIG. 2 explains the partial-irradiation block mask exposure method in this embodiment. (1) The variable rectangular exposure is the same as in FIG. 1. (2) On the other hand, in block mask exposure, in place of the second slit SL2 used in variable rectangular exposure, a block mask BM having a plurality of block masks is used. That is, the first transmission beam EB1 irradiates the entirety of the desired block mask BM1, and the second transmission beam EB2 passing through this block mask BM1 irradiates the wafer WF.

(3) In the partial-irradiation block mask exposure of this embodiment, the first transmission beam EB1 irradiates only a portion of the desired block mask BM1, and the second transmission beam EB2 which has passed through the block mask BM1 irradiates the wafer WF. That is, only a portion of the patterns rather than all the patterns in the block mask BM1 are used, a second transmission beam is created from only the required patterns, and exposure is performed. By means of this partial-irradiation block mask exposure, exposure throughput can be improved to some degree, without unrestrained increases in the number of block masks.

Figure 3:
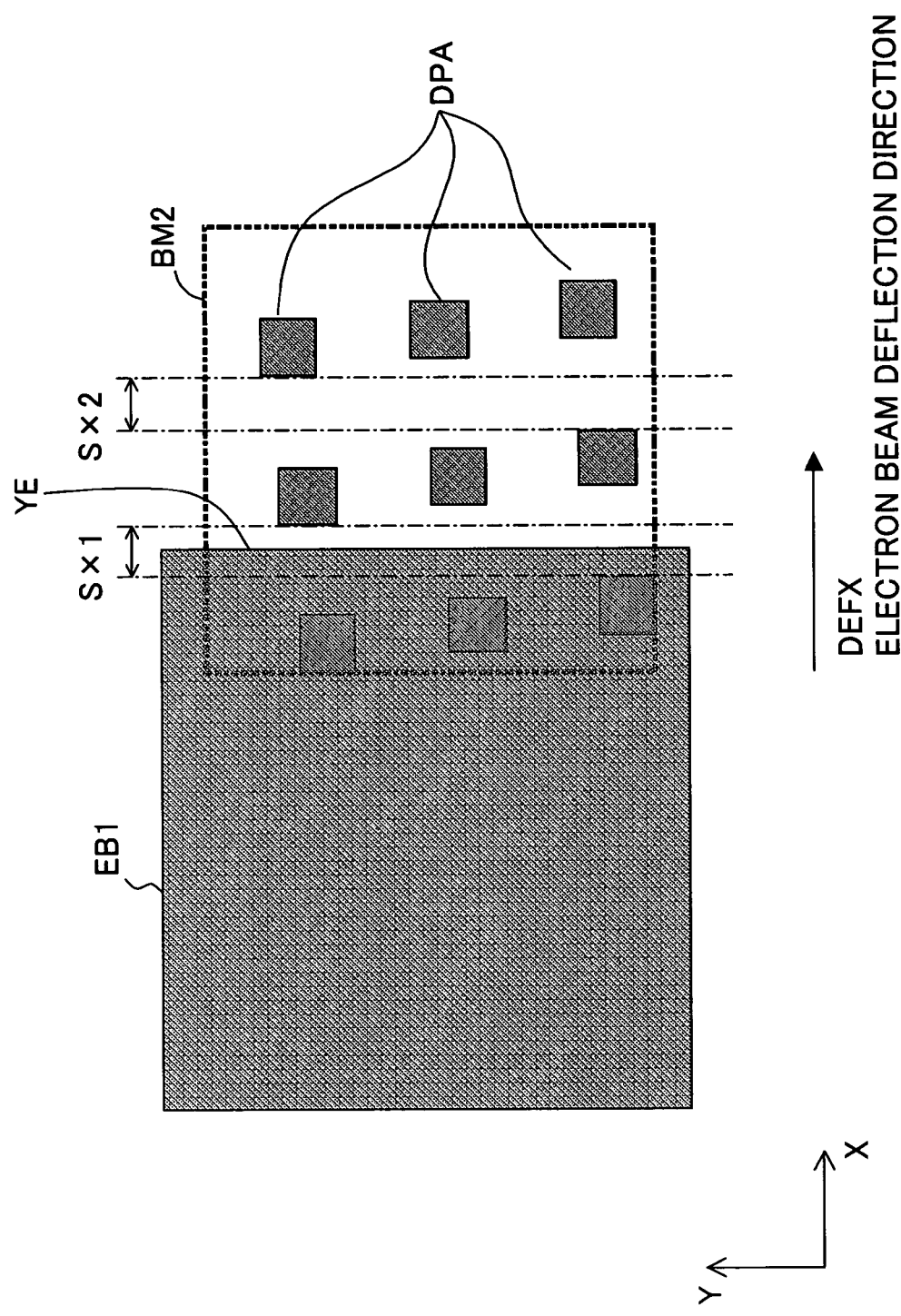
FIG. 3 explains partial-irradiation block mask exposure in an embodiment.

FIG. 3 explains partial-irradiation block mask exposure in the embodiment. In this explanatory drawing, a first transmission beam EB1 irradiates the area of a portion of a block mask BM2 having nine discrete patterns DPA. The discrete patterns DPA within the block mask BM2 are placed at positions shifted along the X-axis and Y-axis directions; a common isolation area SX1 exists between the three discrete patterns of the first column and the three discrete patterns of the second column, and a common isolation area SX2 exists between the three discrete patterns of the second column and the three discrete patterns of the third column. Hence by setting the deflection amount in the X-axis electron beam deflection direction DEFX such that the Y-axis direction edge YE of the first transmission beam EB1 is positioned within the common isolation area SX1, the first transmission beam EB1 can irradiate the block mask as shown in the drawing, so that a second transmission beam having only the three discrete patterns of the first column can be generated. Similarly, upon setting the deflection amount of the first transmission beam EB1 such that the Y-axis direction edge YE is positioned within the common isolation area SX2, the first transmission beam EB1 can be made to irradiate only the six discrete patterns of the first and second columns, and a second transmission beam having only six discrete patterns can be generated.

Figure 4:
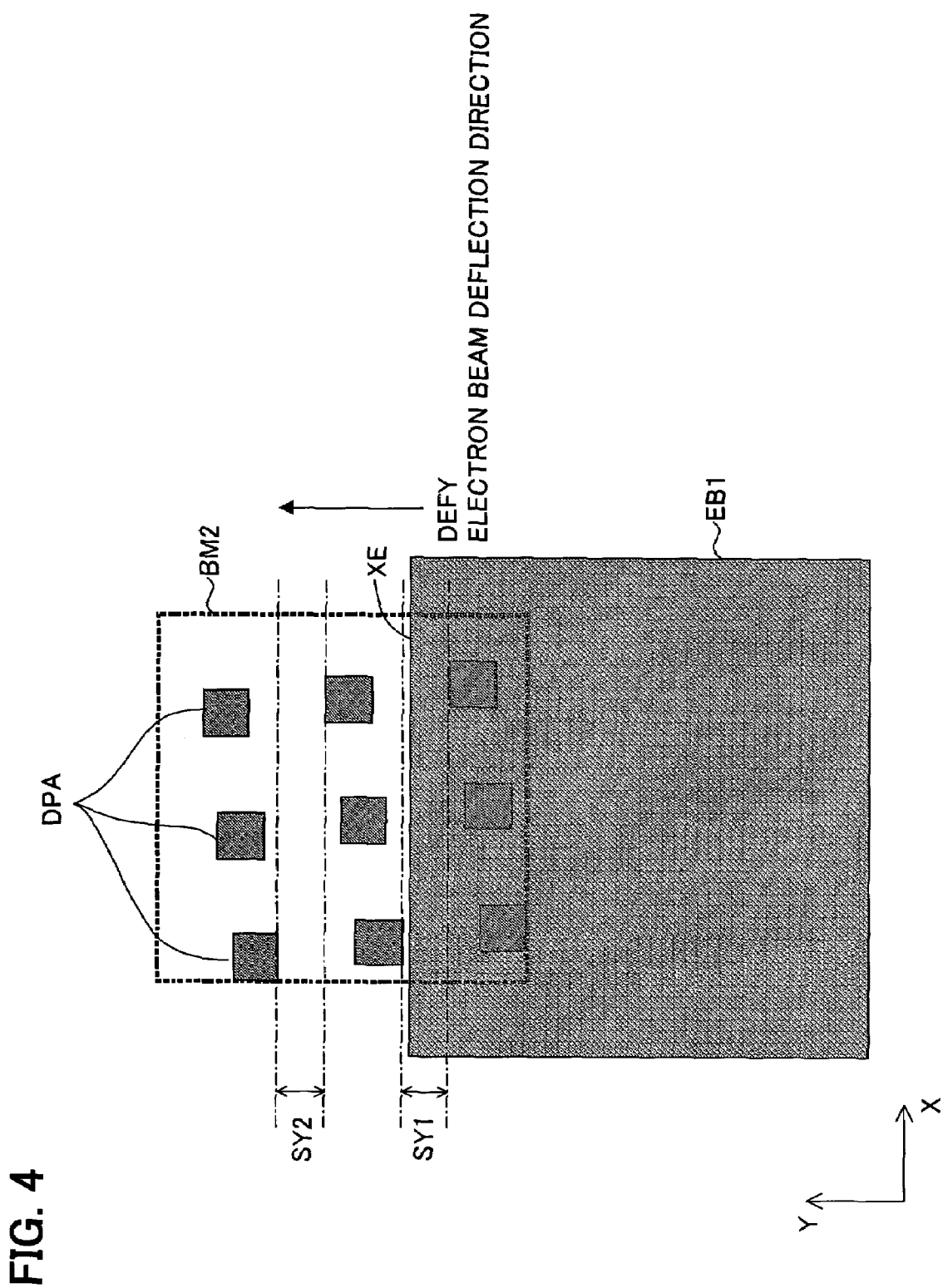
FIG. 4 explains partial-irradiation block mask exposure in an embodiment.

FIG. 4 explains partial-irradiation block mask exposure in the embodiment. In this explanatory drawing also, the first transmission beam EB1 irradiates the area of a portion of the block mask BM2 having nine discrete patterns DPA. In FIG. 4, the first transmission beam EB1 is deflected in the Y-axis direction, so that the first transmission beam EB1 irradiates only a portion of the discrete patterns DPA of the block mask BM2. Six discrete patterns DPA in the block mask BM2 have a common isolation area SY1 between the three discrete patterns of the first row and the three discrete patterns of the second row, as well as a common isolation area SY2 between the three discrete patterns of the second row and the three discrete patterns of the third row. Hence by deflecting the first transmission beam EB1 such that the X-axis direction edge XE of the first transmission beam EB1 is positioned within either of these common isolation areas SY1 or SY2, the first transmission beam EB1 can be made to irradiate only a portion of the discrete patterns in the block mask BM2 having nine discrete patterns, and a second transmission beam having these discrete patterns can be generated.

By combining deflection in the X-axis direction and deflection in the Y-axis direction of the first transmission beam EB1, shown in FIG. 3 and FIG. 4, the edges XE, YE of the first transmission beam EB1 can be positioned in arbitrary common isolation areas X1, X2, Y1, Y2, so that a second transmission beam can be generated having an arbitrary number (1, 2, 3, 4, 6, or 9) of discrete patterns. Thus through partial use of a block mask, the number of types of block masks can be effectively increased, and exposure throughput can be raised.

Figure 5:
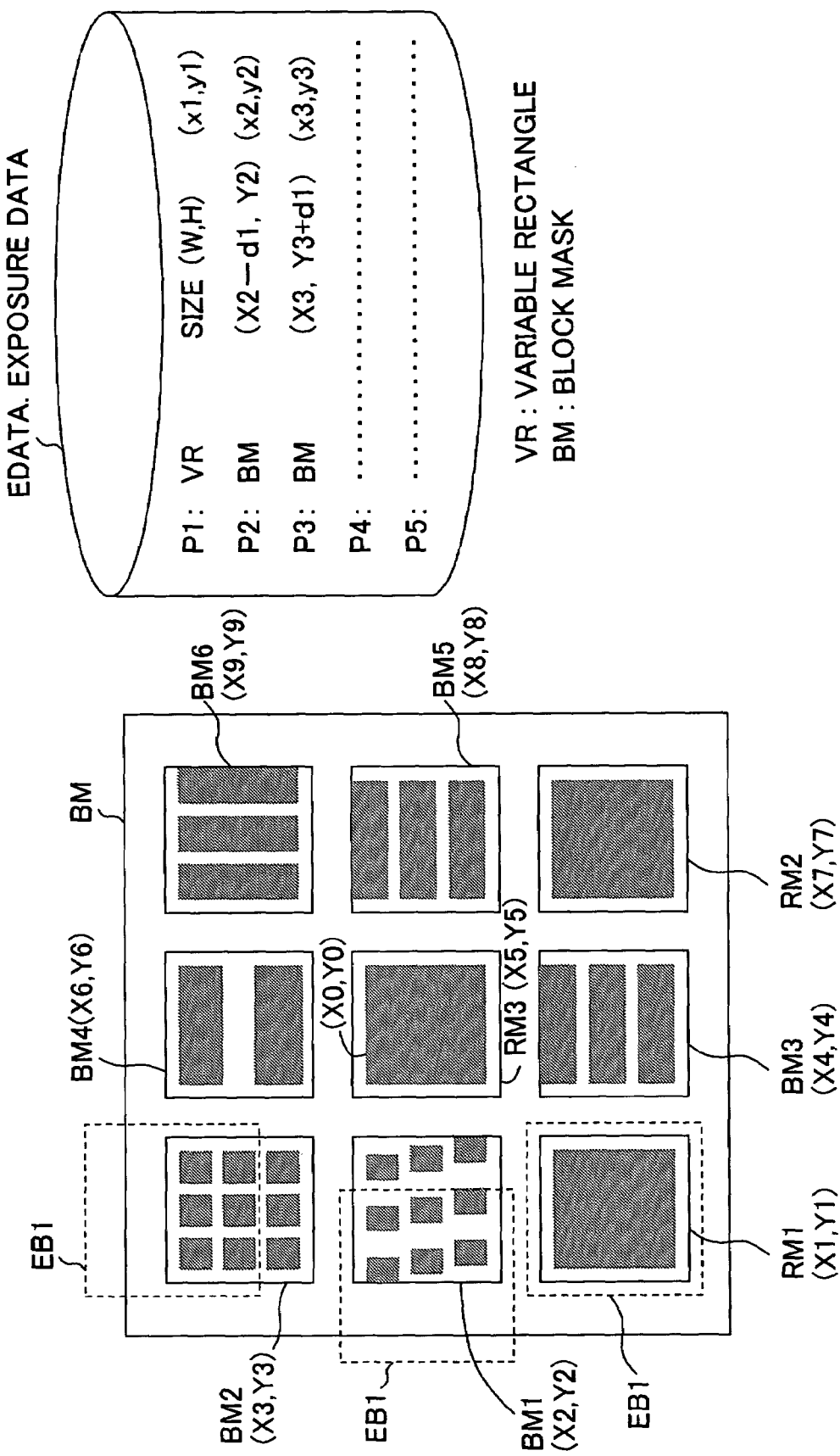
FIG. 5 shows an example of exposure data in partial-irradiation block mask exposure in an embodiment.

FIG. 5 shows an example of exposure data in partial-irradiation block mask exposure of this embodiment. FIG. 5 shows an example of a block mask BM and an example of exposure data EDATA using the block mask BM. In the block mask BM appear six types of block mask BM1 to BM6 having a plurality of discrete patterns, and three rectangular masks RM1, RM2, RM3 used in variable rectangular beam exposure. Because it is conceivable that a rectangular mask will undergo aging and become unusable due to electron beam irradiation over an extended length of time, a plurality of rectangular masks RM1, RM2, RM3 are formed in the block mask BM. Within the block mask BM, XY coordinates are set taking the center as the origin (X0, Y0), and the block masks BM1 through BM6 and rectangular masks RM1 through RM3 are assigned coordinates (X1, Y1) to (X9, Y9) respectively.

The exposure data EDATA of FIG. 5 is an example in which the patterns P1, P2, P3 are exposed using a variable rectangular beam and the block masks BM1 and BM2. It is desirable that the rectangular mask RM1, RM2, or RM3 to be used in the block mask BM be decided at the exposure equipment, and so the data for exposure of the pattern 1 by a variable rectangular beam has attribute data VR indicating a variable rectangle and the size thereof (W, H), and the irradiation coordinates (x1, y1) on the object for exposure.

The exposure data for the pattern P2 has attributed data BM indicating the block mask, the irradiation position coordinates (X2−d1, Y2) on the block mask of the first transmission beam EB1 for this case, and the irradiation coordinates (x2, y2) on the object for exposure. That is, the pattern P2 uses the six discrete patterns of a portion of the block mask BM1, and so the coordinates irradiated by the first transmission beam EB1 are the coordinates (X2−d1, Y2), shifted by the about −d1 in the X-axis direction from the coordinates (X2, Y2) for the case in which the entire block mask BM1 is used.

Similarly, exposure data for the pattern P3 has attribute data BM indicating the block mask, the irradiation position coordinates (X3, Y3+d1) for the first transmission beam EB1 in this case, and the irradiation coordinates (x3, y4) on the object for exposure. That is, the pattern P3 uses six discrete patterns in the block mask BM2, and as shown in the drawing, is formed by deflecting the first transmission beam EB1 by +d1 in the Y-axis direction.

Thus in partial-irradiation block mask exposure, information indicating the extent to which the first transmission beam is to be deflected in the X-axis or Y-axis direction on the block mask (in the above example, d1) is generated as exposure data. Data indicating which block mask, BM1 to BM6, on the block mask BM is to be used is, in the example of FIG. 5, specified by the specific coordinates (X2, Y2) and (X3, Y3), but may also be specified using a block mask ID. In this case, the exposure equipment determines the coordinate data corresponding to the block mask ID, and deflects the first transmission beam EB1 to this coordinate position. In this case also, if the deflection amount data d1 is given, partial-irradiation block mask exposure can be performed.

Figure 6:
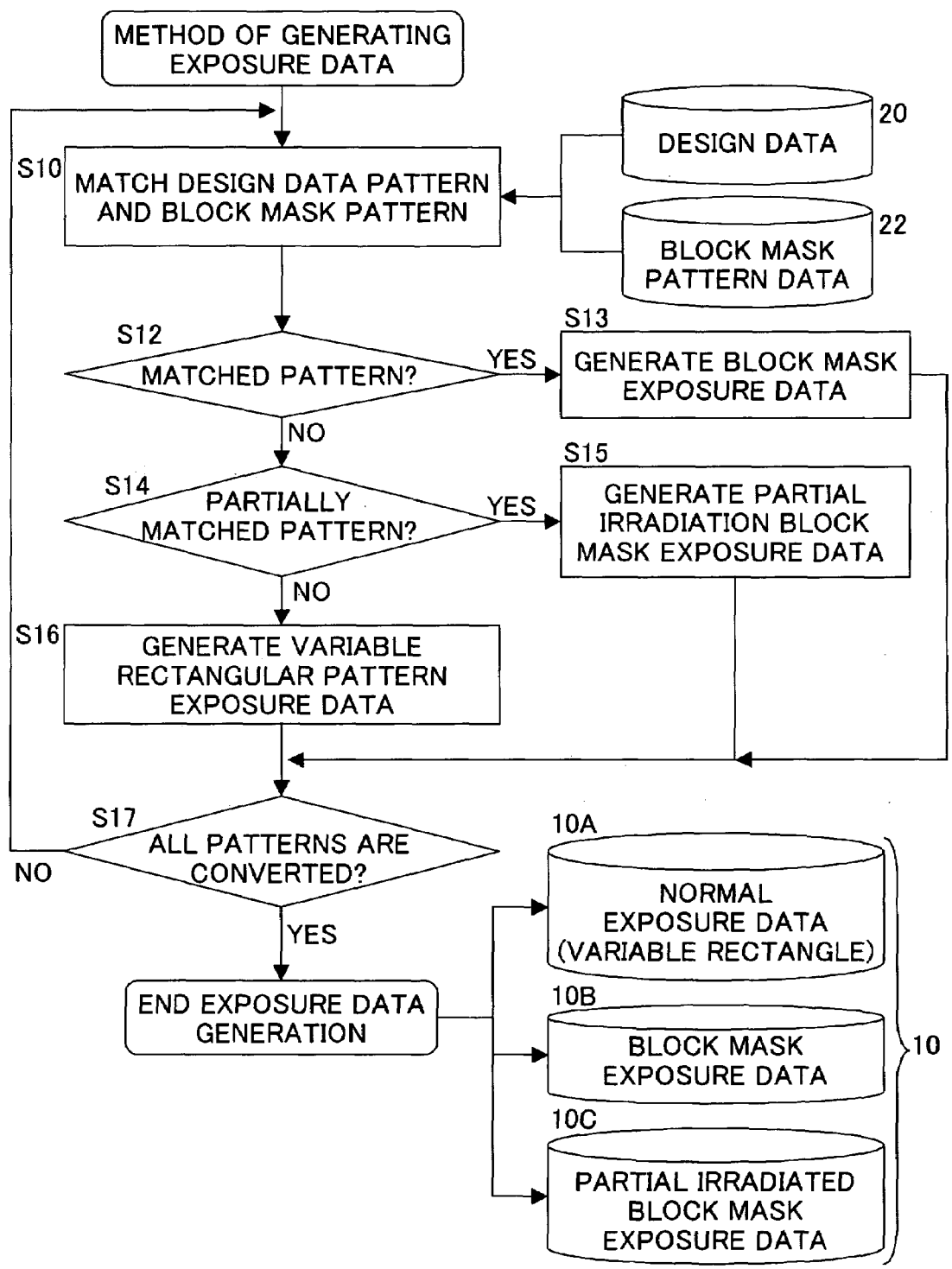
FIG. 6 is a flowchart of a method of generation of exposure data in an embodiment.
Figure 7:
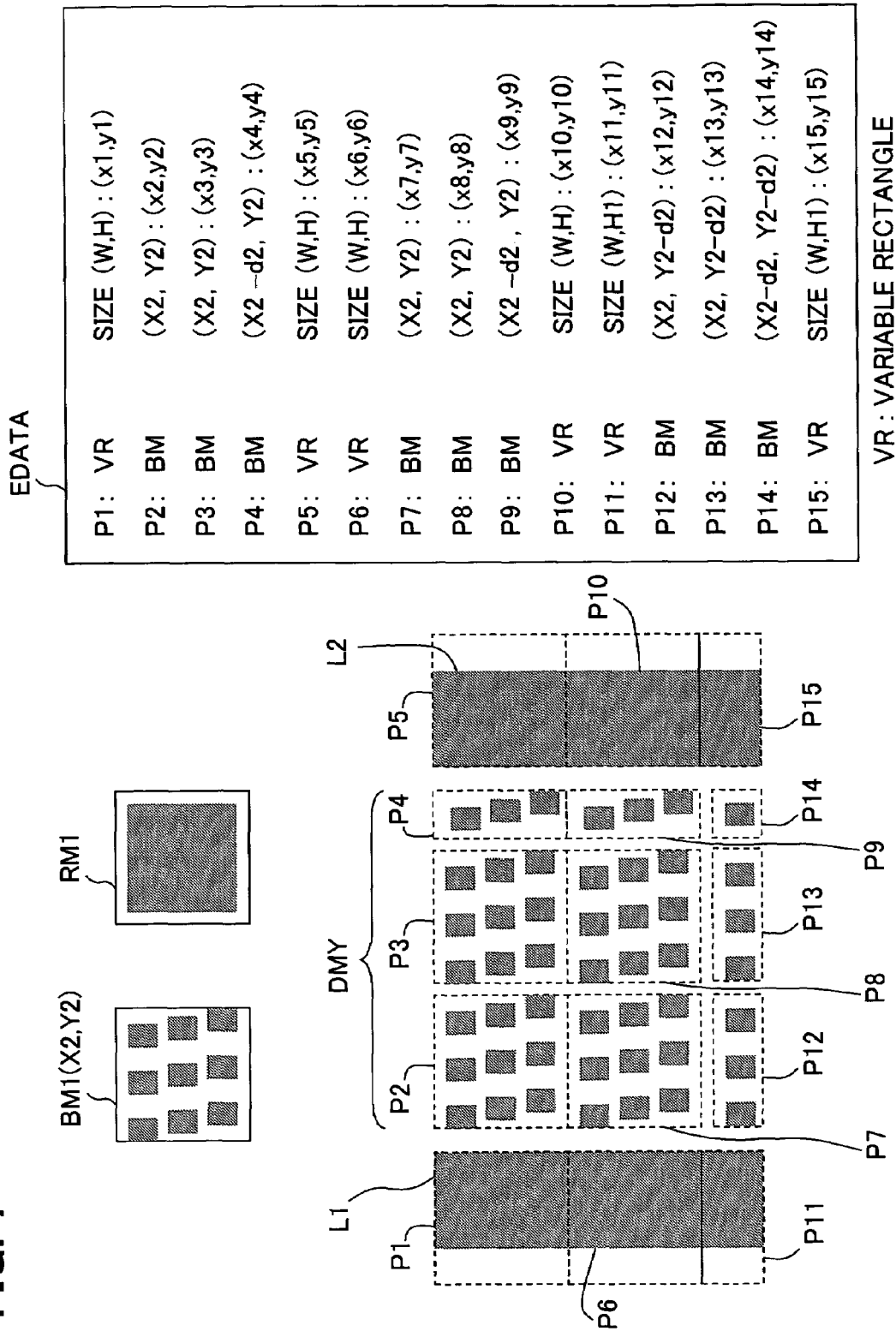
FIG. 7 shows an example of a method of generation of exposure data in an embodiment.

FIG. 6 is a flowchart of a method of generation of exposure data in the embodiment. FIG. 7 shows an example of a method of generation of exposure data. Using the example of FIG. 7, the method of generation of exposure data of FIG. 6 is explained. The design pattern in the specific example of FIG. 7 has a plurality of dummy patterns DMY between the wiring patterns L1 and L2 extending in the vertical direction. In order to expose these design patterns, it is assumed that a block mask BM1 having nine discrete patterns and a rectangular mask RM1 for variable rectangular exposure are used.

As shown in FIG. 6, exposure data 10 is generated from design data 20 having numerous pattern data items. Block mask pattern data 22 is generated in advance for design data 20 according to frequently occurring repeated patterns. Hence the exposure step for design data 20 is performed by block mask exposure using block masks insofar as possible, and remaining patterns are exposed using variable rectangular exposure. Consequently design data 20 is converted into block mask exposure data 10B and variable rectangular exposure data 10A.

In the step of generating exposure data, patterns are extracted from the patterns of the given design data 20 which match the block mask patterns 22 (S10). For example, in the example of FIG. 7, the patterns P2, P3, P7, P8 among the dummy patterns DMY match patterns of the block mask BM1. When there is a match with a block mask pattern (S12), exposure data using the block mask is generated (S13). In the example of FIG. 7, exposure data for the patterns P2, P3, P7, P8 has the block mask attribute BM, the coordinates on the block mask (X2, Y2), and the respective irradiation coordinates on the wafer (x2, y2), (x3, y3), (x7, y7), and (x8, y8).

Moreover, in the step of generating exposure data of this aspect, design patterns which partially match patterns of the block mask are extracted (S14). When there exist partially matching patterns, the deflection amount d2 to partially irradiate the block mask is reflected in the coordinates on the block mask. In the example of FIG. 7, the patterns P4 and P9 match the three discrete patterns of the first column of the block mask BM1. Hence exposure data EDATA for these patterns P4 and P9 has the coordinates on the block mask (X2−d2, Y2) and the respective irradiation coordinates on the wafer (x4, y4) and (x9, y9). Similarly, the patterns P12 and P13 match the three discrete patterns of the first row of the block mask BM1. Hence the exposure data EDATA for the patterns P12 and P13 has the coordinates on the block mask (X2, Y2−d2) and the respective wafer irradiation coordinates (x12, y12) and (x13, y13). The pattern P14 matches a single discrete pattern of the block mask BM. The exposure data for this pattern P14 has the coordinates on the block mask (X2−d2, Y2−d2) and the wafer irradiation coordinates (x14, y14). This pattern P14 can also be exposed by variable rectangular exposure. Thus as described above, the coordinates (X2−d2, Y2) (X2, Y2−d2) or deflection amount d2 for irradiation of only the matching discrete pattern are created as partial-irradiation block mask exposure data for the pattern (S15).

Among the design data patterns, a pattern which does not match a block mask pattern or pattern in a portion thereof is converted into variable rectangular pattern exposure data (S16). In the example of FIG. 7, the wiring pattern L1 is converted into the rectangular patterns P1, P6, P11, and the wiring pattern L2 is converted into the rectangular patterns P5, P10, P15. As explained above, exposure data for a variable rectangular pattern has attribute data VR indicating that the pattern is a variable rectangular pattern, the pattern size (W, H), and the irradiation coordinates on the wafer.

Returning to FIG. 6, when the patterns for all the design data have been converted into exposure data, the exposure data generation step ends (S17). As a result, exposure data 10 is generated comprising normal exposure data (variable rectangular data) 10A, block mask exposure data 10B, and partial-irradiation block mask exposure data 10C. In this aspect, the dummy patterns P4, P9, P12, P13 in FIG. 7 can each be exposed in a single beam shot using a portion of the block mask BM1. Hence compared with cases in which small rectangular patterns are all exposed through variable rectangular beam exposure, the number of electron beam shots can be reduced, and throughput of the exposure step can be raised.

Figure 8:
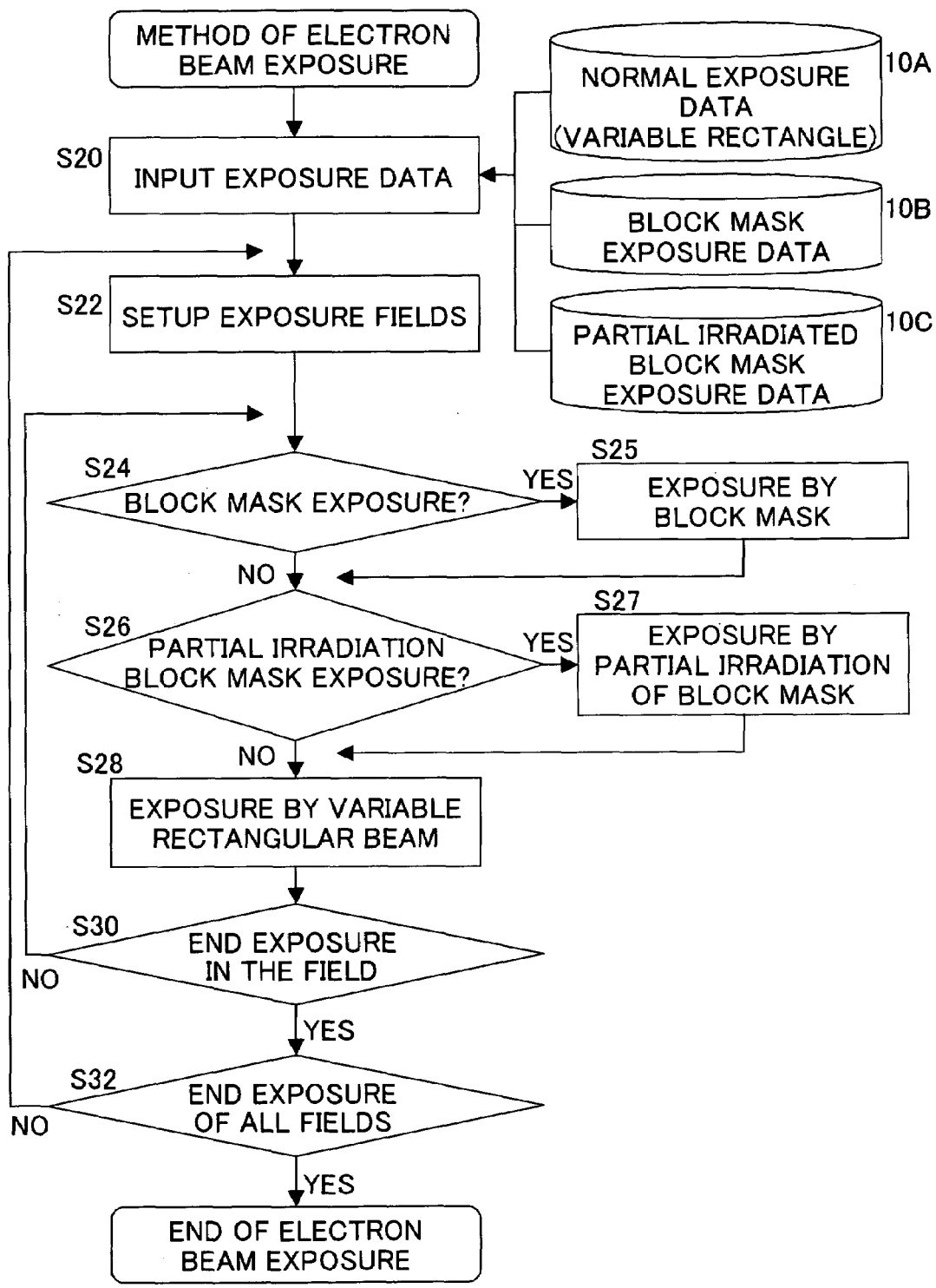
FIG. 8 is a flowchart of an electron beam exposure method in an embodiment.

FIG. 8 is a flowchart of the electron beam exposure method of the embodiment. In the electron beam exposure method, first the exposure data 10A, 10B, 10C are obtained (S20), the exposure field of the exposure equipment is set (S22), and within the exposure field thus set and based on the exposure data, a first transmission beam is made to irradiate a prescribed position on the block mask to generate a second transmission beam, and based on the irradiation coordinates of the exposure data the second transmission beam is made to irradiate the desired position on the wafer. In this case, when the exposure data comprises block mask exposure (S24), exposure is performed using the block mask (S25). If the exposure data is the examples shown in FIG. 5 and FIG. 7, then even when performing partial-irradiation block mask exposure using a portion of a block mask, it is sufficient to deflect the first transmission beam according to the block mask coordinate data in the exposure data. However, in the case of partial-irradiation block mask exposure, when the exposure data comprises a block mask ID (BM1, BM2, or similar) in place of block mask coordinate data together with deflection amount data (d1, d2, or similar) to enable use of this portion, the coordinates on the block mask of the first transmission beam must be computed at the exposure equipment. Hence as indicated in steps S26 and S27 in FIG. 8, when the exposure data is for partial-irradiation block mask exposure, the above-described coordinate computation is performed, and the first transmission beam is deflected to the coordinate position thus computed to perform partial-irradiation block mask exposure (S27).

When exposure data is neither for block mask exposure nor for partial-irradiation block mask exposure, variable rectangular beam exposure is performed based on the pattern size of the exposure data (S28).

The above steps S24 to S28 are repeated until exposure is completed for all patterns within the field set (S30). Processing is similarly repeated until exposure is completed for all fields (S32).

Method of Generation of Partial-Irradiation Block Mask Exposure Data

Next, the specific method of determining the deflection amounts d1 and d2 necessary for partial-irradiation block mask exposure data is explained.

Figure 9:
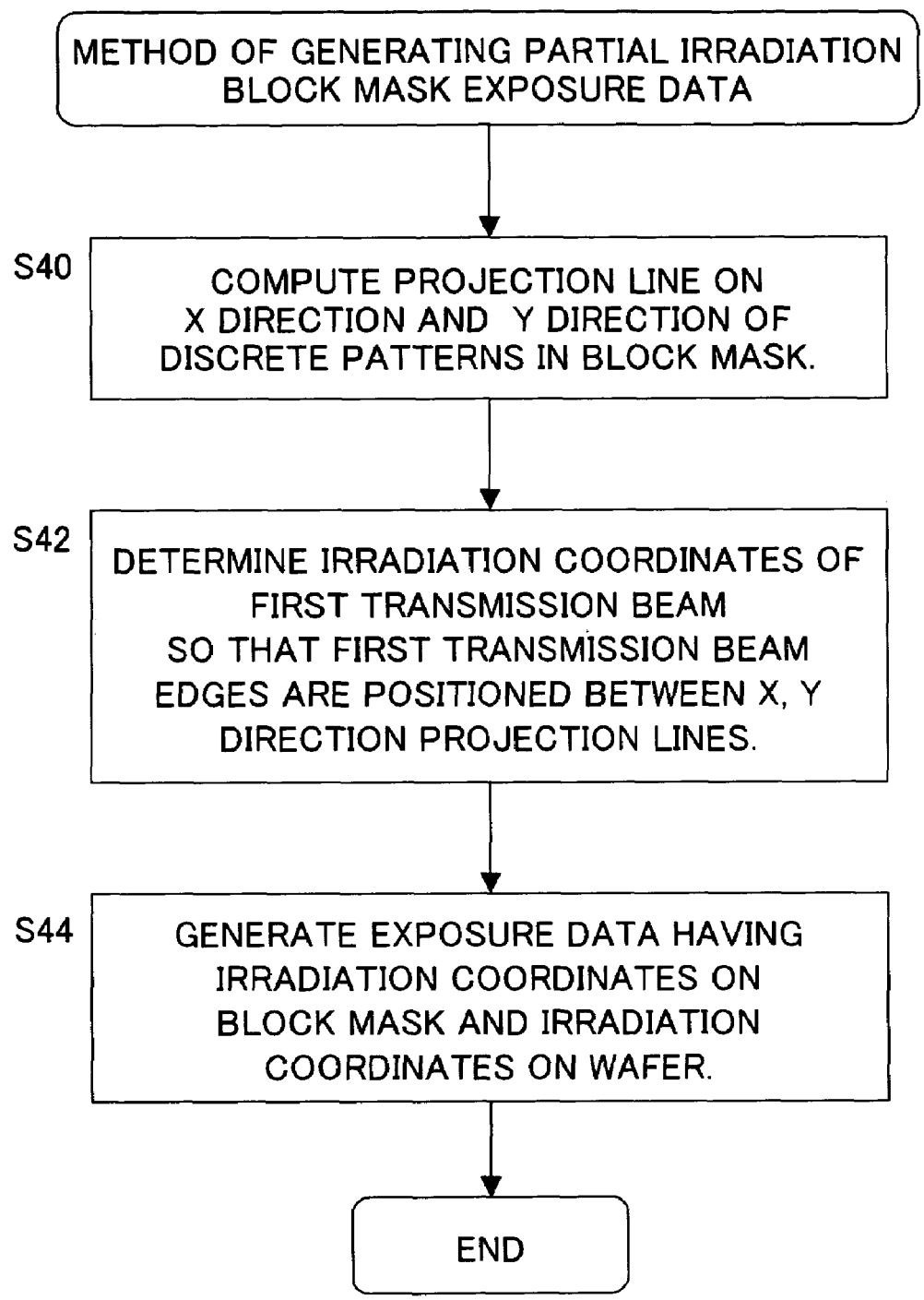
FIG. 9 is a flowchart showing a first example of a method of generation of exposure data for a partial-irradiation block mask.
Figure 10:
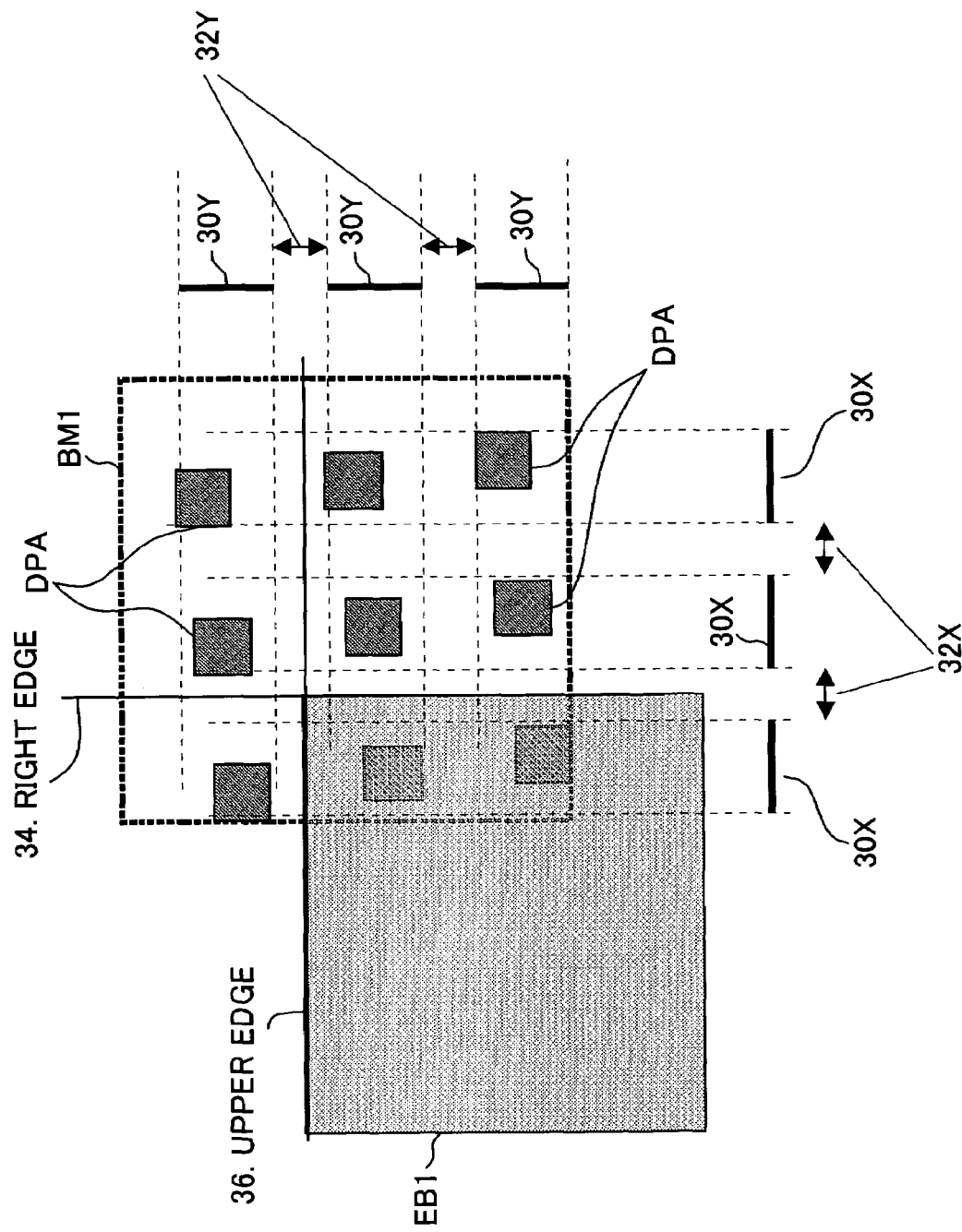
FIG. 10 shows a specific example of the generation method of FIG. 9.

FIG. 9 is a flowchart showing a first example of a method of generation of partial-irradiation block mask exposure data. FIG. 10 shows a specific example of the generation method of FIG. 9. In this generation method, the block mask pattern data is processed, and the projection line 30X on the X axis and projection line 30Y on the Y axis for a discrete pattern DPA in the block mask are computed (S40). The projection lines 30X and 30Y indicating the projection area of this discrete pattern can for example be determined by extracting the X coordinate value or Y coordinate value for all the discrete patterns DPA among the pattern data for the block mask. That is, if there exists an X coordinate value or Y coordinate value for even one discrete pattern, then the projection line can be generated by creating a projection line to the coordinate. The areas of these projection lines correspond to the common isolation areas SX and SY.

In the example of FIG. 10, the discrete patterns DPA are shifted in the X and Y directions relative to each other, but by determining the projection lines 30X and 30Y, the areas 32X, 32Y between the projection lines 30X and 30Y can be identified as the area in which the edges of the first transmission beam EB1 should be positioned. That is, the upper edge 36 of the first transmission beam EB1 should be positioned in one of the areas 32Y, and the right edge 34 should be positioned in one of the areas 32X. The areas 32Y, 32X in which the upper edge 36 and right edge 34 of the first transmission beam EB1 should be positioned are decided according to the type of matching partial block mask, that is, according to the number of matching discrete patterns DPA and similar. The irradiation coordinates of the first transmission beam EB1 on the block mask BM1, for example, (X−d1, Y+d1), can be determined according to the areas 32X, 32Y thus decided (S42). In particular, by setting the deflection amount d1 such that edges are positioned at the centers of the areas 32X and 32Y, the allowable margin of deflection error can be made large. Exposure data comprising the irradiation coordinates on the block mask thus determined and irradiation coordinates on the wafer is then generated (S44).

Figure 11:
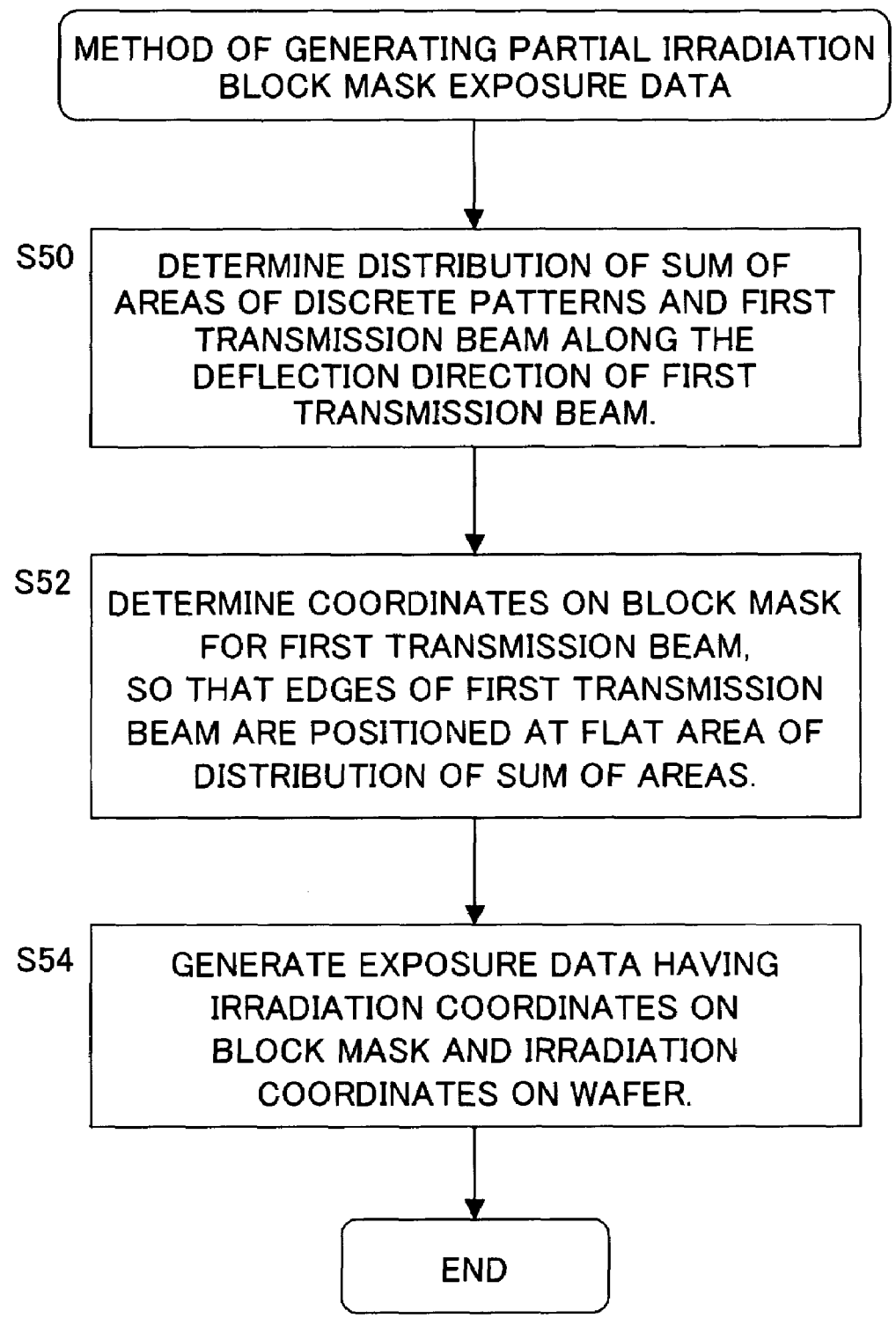
FIG. 11 is a flowchart showing a second example of a method of generation of partial-irradiation block mask exposure data.
Figure 12:
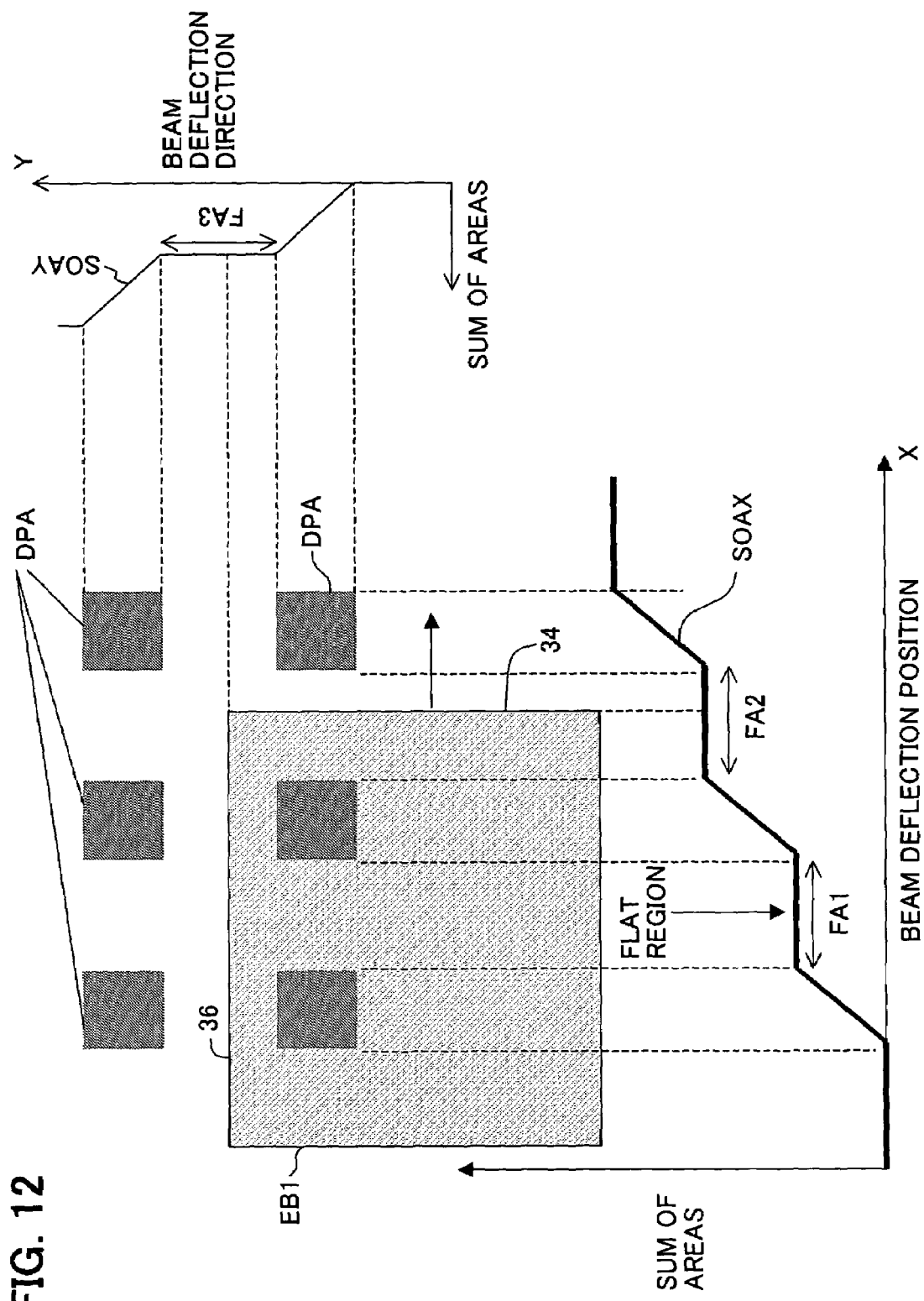
FIG. 12 shows a specific example of the generation method of FIG. 11.

FIG. 11 is a flowchart showing a second example of a partial-irradiation block mask exposure data generation method. FIG. 12 shows a specific example of the generation method of FIG. 11. In this generation method, the block mask pattern data and first transmission beam pattern data are processed, and the sum of the areas of the discrete patterns DPA within the block mask and of the first transmission beam EB1 are computed while the deflection position of the first transmission beam is being changed (S50). In FIG. 12, the sum of the areas SOAX while the beam deflection position is being changed in the X-axis direction, and the sum of the areas SOAY while the beam deflection position is being changed in the Y-axis direction, are shown. According to change of the sum of areas when the edges 34 and 36 of the first transmission beam EB1 move over discrete patterns DPA, the sums of areas SOAX and SOAY increase, but when the edges 34 and 36 move over areas in which there are no discrete patterns DPA, there is no increase in the sum of areas, and the gradient is flat. By thus determining the distribution of sums of areas while the first transmission beam EB1 is scanned in the X-axis direction or Y-axis direction, the flat areas FA1, FA2, FA3 can be found. Processing to determine sums of areas can be performed simply and rapidly by for example AND operations on pattern data. These flat areas then correspond to the common isolation areas SX and SY.

In this generation method, the flat areas FA1, FA2, FA3 in which the upper edge 36 and right edge 34 of the first transmission beam EB1 should be positioned are decided according to the type of matching partial block mask, that is, according to the number of matching discrete patterns DPA. The irradiation coordinates on the block mask BM1 of the first transmission beam EB1, such as for example (X−d1, Y+d1), can be determined according to the flat areas decided in this way (S52). In the example of FIG. 12, the right edge 34 of the first transmission beam EB1 is set in the center position of the flat area FA2, and the upper edge 36 is set in the center position of the flat area FA3. In particular, if edge positions are set in the center positions of flat areas, the allowable margin of deflection error can be made large.

Then, exposure data comprising the computed coordinates on the block mask and the irradiation coordinates on the wafer is generated (S54).

Figure 13:
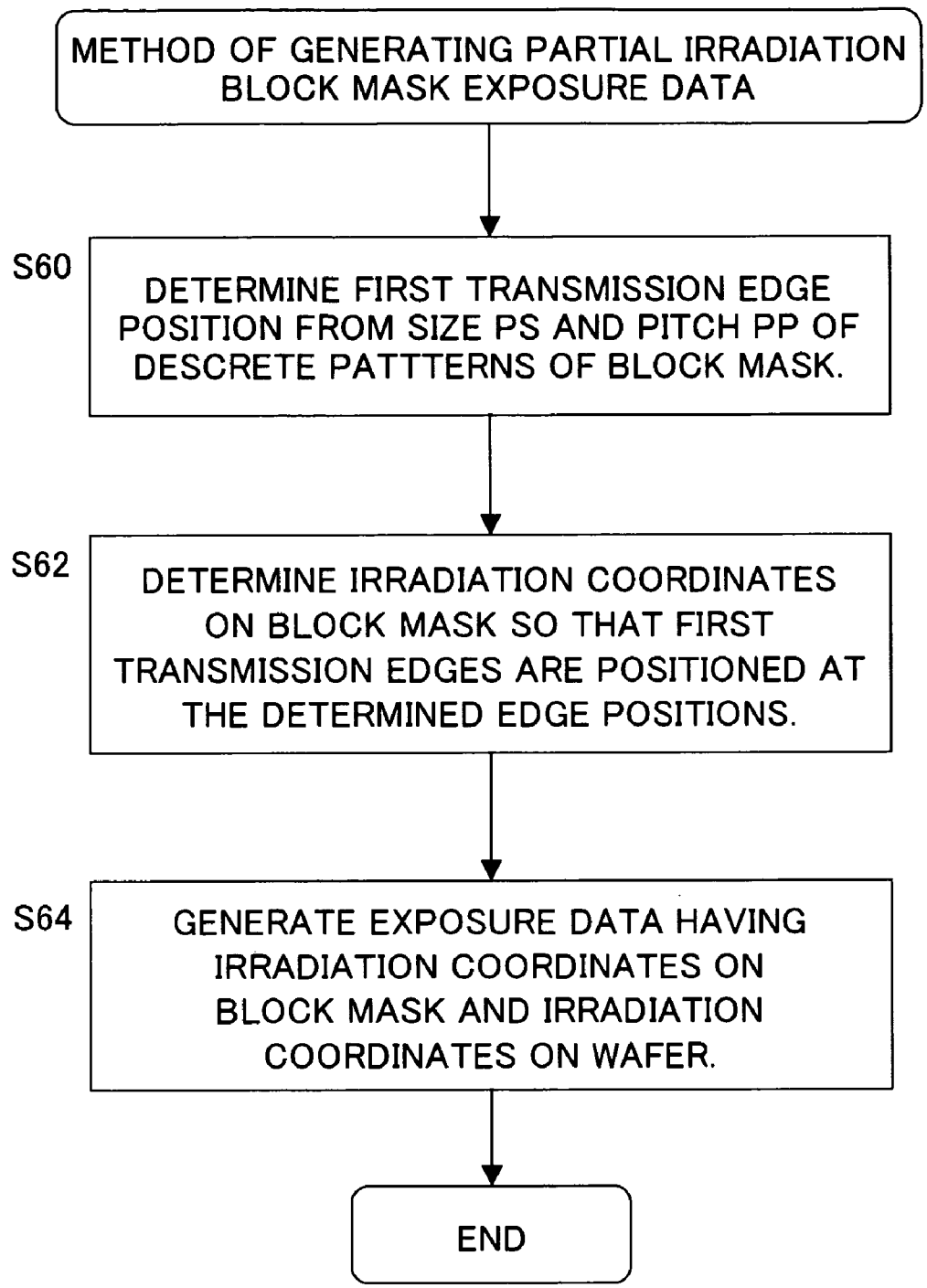
FIG. 13 is a flowchart showing a third example of a method of generation of exposure data for a partial-irradiation block mask.
Figure 14:
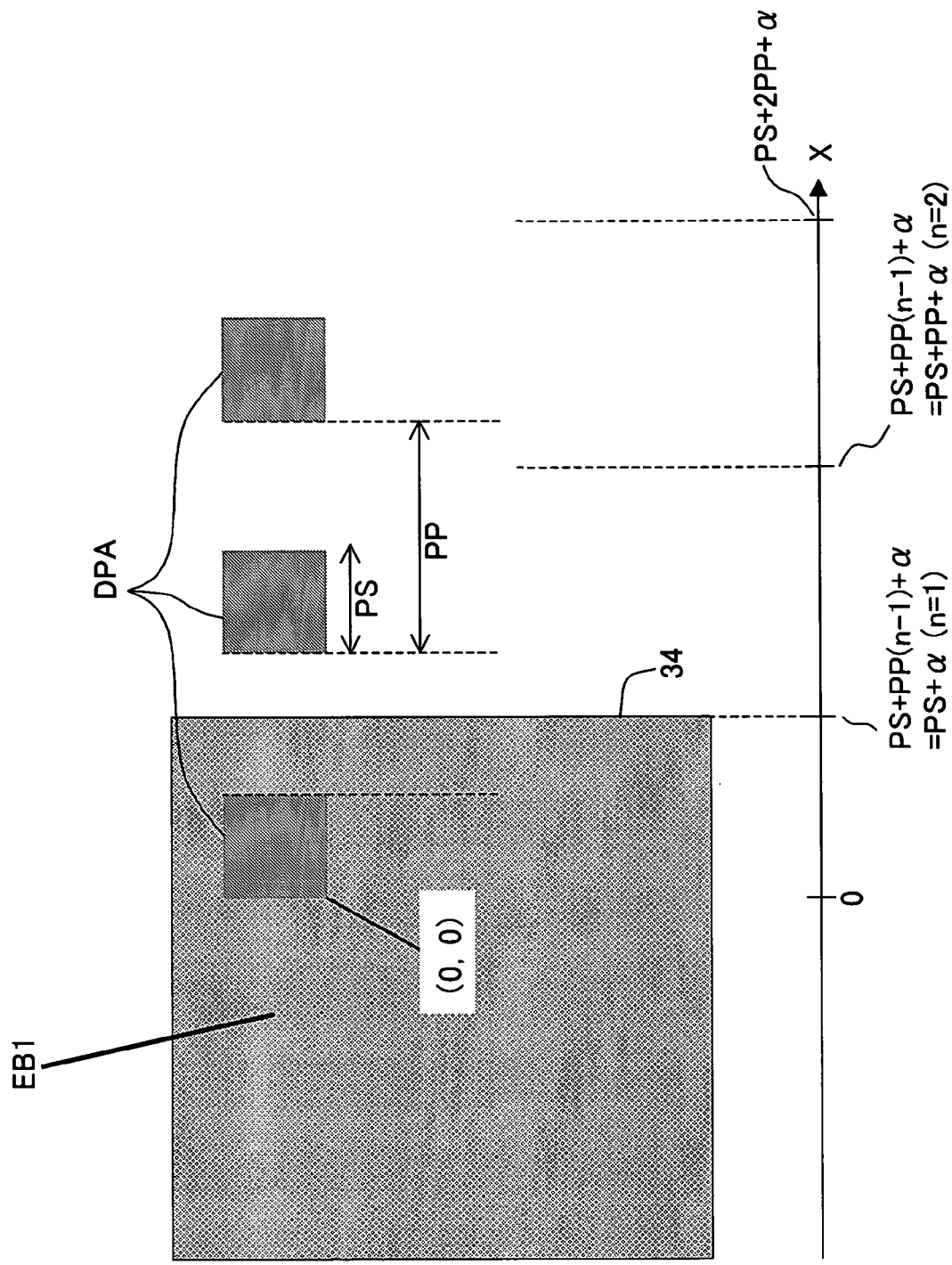
FIG. 14 shows a specific example of the generation method of FIG. 13.

FIG. 13 is a flowchart showing a third example of a method of generation of exposure data for a partial-irradiation block mask. FIG. 14 shows a specific example of the generation method of FIG. 13. In this generation method, the block mask pattern data is processed, and coordinates at which the edges of the first transmission beam EB1 are to be positioned are computed (S60). In the specific example of FIG. 14, of the 3×1 discrete patterns DPA, the lower-left of the discrete pattern DPA on the left edge is taken as the origin (0, 0); if the size of each of the discrete patterns is PS and the pitch of the discrete patterns is PP, then the coordinates at which the edge 34 of the first transmission beam EB1 are to be positioned are determined from the formula PS+PP(n−1)+α. Here, n is the number of matching discrete patterns, and α is a value between 0 and (PP−PS), but is preferably (PP−PS)/2. When the block mask has 3×3 discrete patterns, the coordinates at which the edge 34 is to be positioned are computed using the above formula for each 3×1 group of discrete patterns, and the average value of these coordinates is taken to be the coordinates at which the edge of the first transmission beam is to be positioned for the 3×3 discrete patterns. In the example of FIG. 14, the coordinates at which the right edge 34 of the first transmission beam EB1 are to be positioned are computed to be the three values PS+α, PS+PP+α, and PS+2PP+α. When the coordinate value of the right edge 34 is PS+α, one discrete pattern is used; when the value is PS+PP+α, two discrete patterns are used; and when the value is PS+2PP+α, three discrete patterns are used.

The coordinates on the block mask of the first transmission beam are then computed such that the edge of the first transmission beam is positioned at one of the computed coordinate positions, according to the number of matching patterns (S62). Exposure data is thus generated having computed coordinates on the block mask and irradiation coordinates on the wafer (S64).

Figure 15:
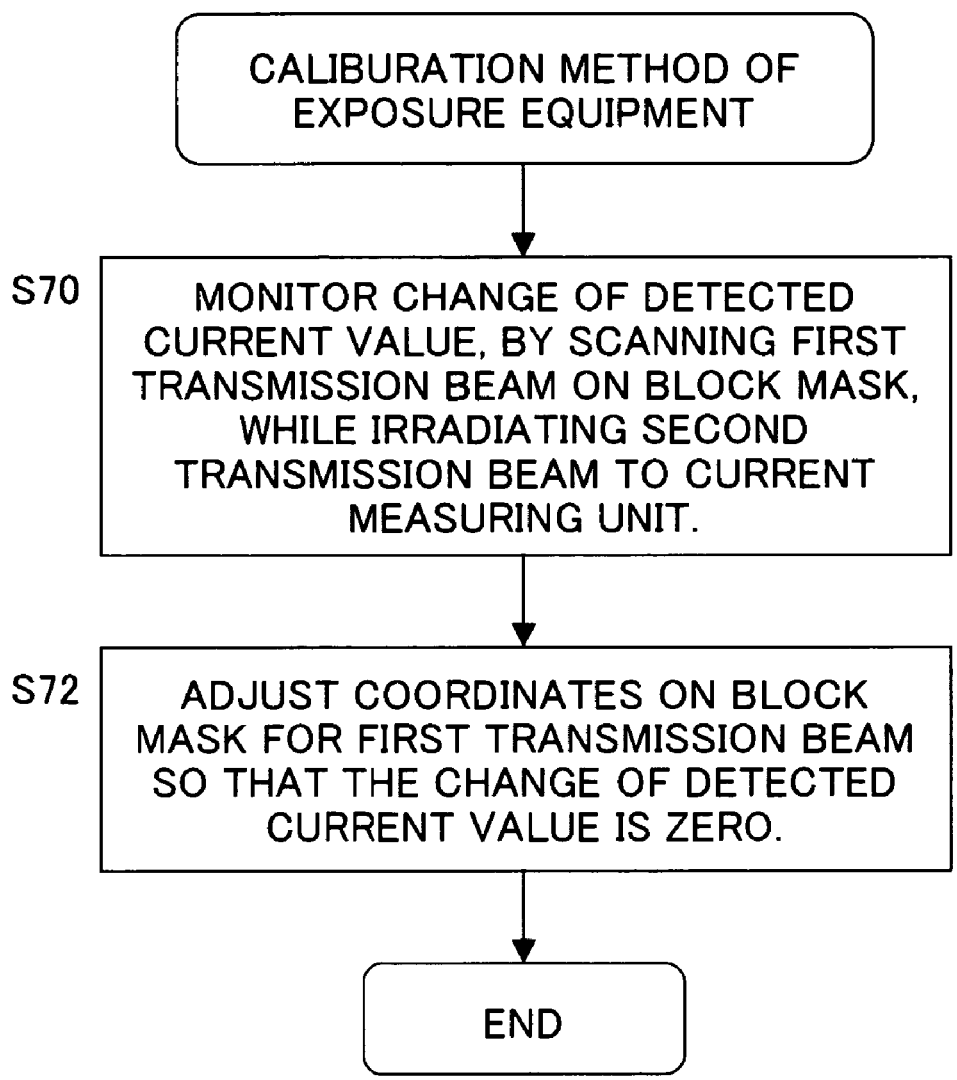
FIG. 15 is a flowchart showing a method of calibration for partial irradiation block exposure in an aspect; and, FIG. 16 shows a specific example of FIG. 15.
Figure 16:
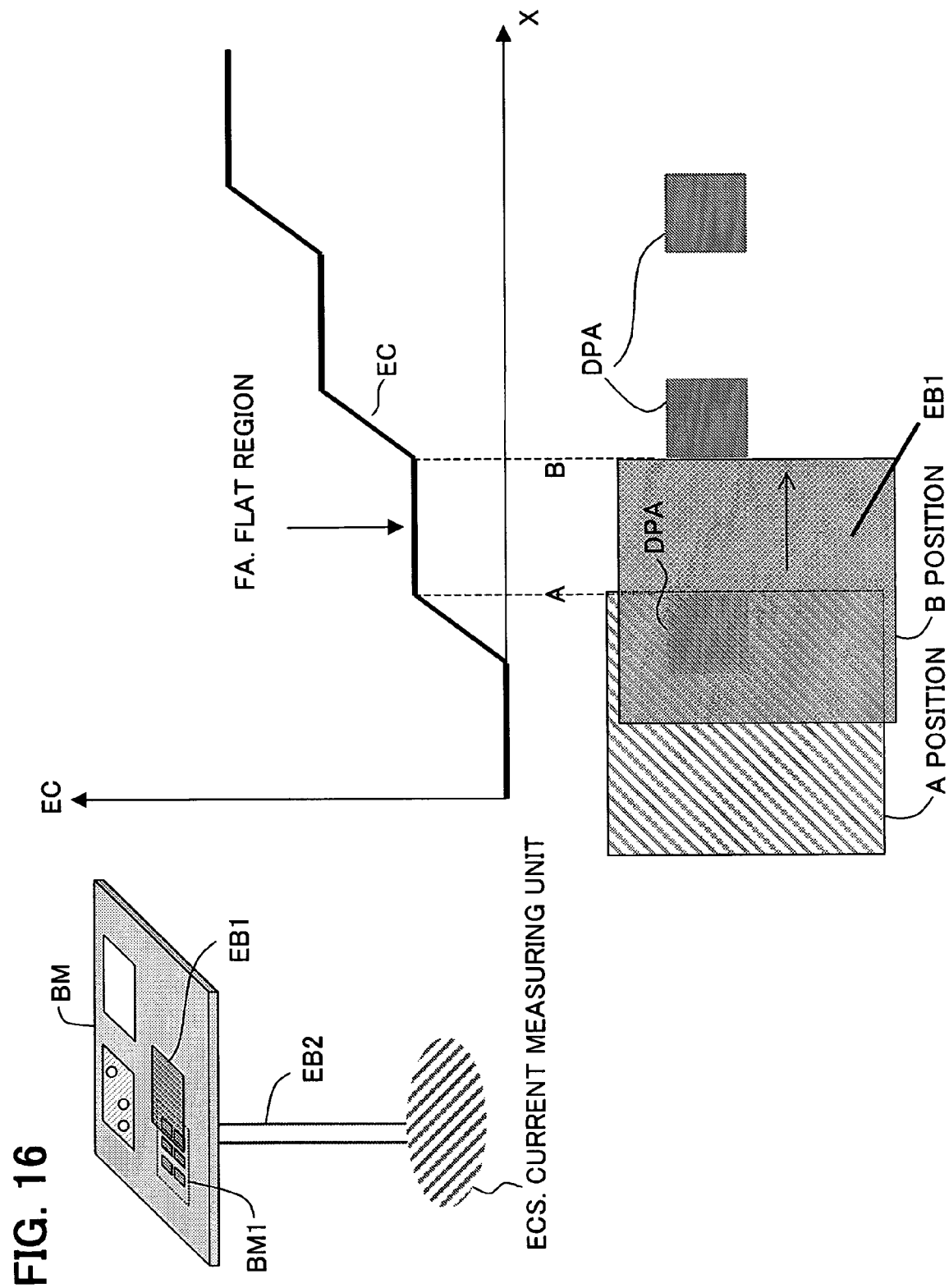

FIG. 15 is a flowchart showing a method of calibration for partial irradiation block exposure in this embodiment. FIG. 16 shows a specific example of FIG. 15. In partial-irradiation block mask exposure, the first transmission beam irradiates the area of a portion of the block mask. Hence the first transmission beam must be deflected with high accuracy to a prescribed coordinate position on the block mask. Hence in order to maintain high deflection accuracy, a method of calibrating the deflectors or similar of the exposure equipment is needed.

In this calibration method, the deflection position of the first transmission beam is calibrated in the exposure equipment in order to perform partial-irradiation block mask exposure. As shown in FIG. 16, the first transmission beam EB1 irradiates the block mask BM1, and the second transmission beam EB2 resulting from this irradiates a current-measuring unit ECS provided in the exposure equipment. While maintaining irradiation of the current-measuring unit ECS by the second transmission beam EB2, the first transmission beam EB1 is scanned over the block mask BM1. The electric current detected by the current-measuring unit ECS during scanning of the first transmission beam EB1 is monitored (S70). In FIG. 16, the graph EC shows the detected current value when the first transmission beam EB1 is scanned in the X-axis direction when there are 3×1 discrete patterns DPA. When the first transmission beam EB1 is scanned over the discrete patterns DPA, the detected current increases; but while the right edge of the first transmission beam EB1 is not in any of the discrete patterns DPA, the rate of increase of the detected current EC is zero. This flat area FA is used as a deflection position on the block mask BM1 for the first transmission beam EB1.

Hence the coordinates on the block mask of the first transmission beam are adjusted to a position in the flat area FA in which the change in detected current is zero. Specifically, the coordinate value on the block mask of the first transmission beam, comprised by the exposure data, is corrected to the coordinate position determined by the above calibration method, so that exposure is performed at the calibrated position. In other words, due to aging of the exposure equipment, the coordinate position determined by pattern data processing gradually changes until it is no longer an appropriate deflection position, and so the above-described calibration method must be used to correct the coordinate position.

Taking into consideration errors in actual current measurement, for the change in the above-described detected current to become zero means that no change in the increasing gradient of the substantive current value can be recognized.

By means of the above embodiments, electron beam exposure can be performed using the area of a portion of a block mask, so that even when there are constraints on the number of block masks, the variety of block mask beams can be increased so that the number of electron beam shots can be reduced, and throughput of electron beam exposure can be raised.

What is claimed is:

1. An exposure data generation method for charged particle beam exposure, in which a charged particle beam is passed through a rectangular first transmission aperture to form a first transmission beam, the first transmission beam is passed through a block mask having a plurality of discrete patterns to form a second transmission beam, and the second transmission beam irradiates an object for exposure, comprising:
    a step of generating data for a irradiation position on said block mask of said first transmission beam, such that a Y-direction or X-direction edge of said first transmission beam is positioned in a common isolation area in the X direction or Y direction of said plurality of discrete patterns in the block mask.

2. The exposure data generation method for charged particle beam exposure according to claim 1, wherein said common isolation area is an area in which isolation areas between discrete patterns commonly overlap in the X direction or in the Y direction.

3. The exposure data generation method for charged particle beam exposure according to claim 1, wherein said step of generating irradiation position data comprises:
    a step of determining, for a plurality of discrete patterns of the block mask, projection areas in the Y direction or in the X direction of said plurality of discrete patterns on the X axis or on the Y axis, and
    a step of generating said irradiation position data such that the edge of said first transmission beam is positioned between the projection areas.

4. The exposure data generation method for charged particle beam exposure according to claim 3, wherein in said irradiation position data generation step, the edge of said first transmission beam is positioned in the center position of an area between said projection areas.

5. The exposure data generation method for charged particle beam exposure according to claim 1, wherein said irradiation position data generation step comprises:
    a step of determining, while scanning said first transmission beam over a plurality of discrete patterns of the block mask, overlapping area of said discrete patterns and the first transmission beam at different scan positions, and
    a step of generating, as said irradiation position data, a scan position at which rate of increase of the overlapping area with changes in said scan position is zero.

6. The exposure data generation method for charged particle beam exposure according to claim 5, wherein in said irradiation position data generation step, the edge of the first transmission beam is positioned at the center position of the scan area in which said rate of area increase is zero.

7. The exposure data generation method for charged particle beam exposure according to claim 1, wherein said irradiation position data generation step comprises:
    a step of determining said common isolation areas based on size and pitch of the plurality of discrete patterns of the block mask, and
    a step of generating said irradiation position data such that the edge of the first transmission beam is positioned in said common isolation areas.

8. The exposure data generation method for charged particle beam exposure according to any of claims 1 through 7, wherein the plurality of discrete patterns of said block mask are mutually shifted in position in the X-axis direction or in the Y-axis direction.

9. A charged particle beam exposure method, in which a charged particle beam is passed through a rectangular first transmission aperture to form a first transmission beam, the first transmission beam is passed through a block mask having a plurality of discrete patterns to form a second transmission beam, and the second transmission beam irradiates an object for exposure, comprising the steps of:
    irradiating said block mask with said first transmission beam according to data for the irradiation position on said block mask by said first transmission beam, such that a Y-direction or X-direction edge of said first transmission beam is positioned in an X-direction or Y-direction common isolation area of said plurality of discrete patterns of the block mask; and
    scanning said first transmission beam over said plurality of discrete patterns of the block mask while irradiating a beam intensity sensor which measures the beam intensity with said second transmission beam, and performing calibration such that said irradiation position data is set to the scanning position at which the change in the intensity detected by said beam intensity sensor is substantially zero.

10. The charged particle beam exposure method according to claim 9, wherein, in said calibration step, calibration is performed so as to adjust said calibrated irradiation position data to the scan position corresponding to the center position of the area in which the change in the intensity detected by said beam intensity sensor is substantially zero.

11. The charged particle beam exposure method according to claim 9, wherein said charged particle beam is an electron beam, and said beam intensity sensor is an electron beam current measurement device.

12. The charged particle beam exposure method according to any of claims 9 through 11, wherein the plurality of discrete patterns of said block mask are mutually shifted in position in the X-axis direction or in the Y-axis direction.

* * * * *